United States Patent

Lee et al.

(10) Patent No.: US 8,860,941 B2
(45) Date of Patent: Oct. 14, 2014

(54) TOOL INDUCED SHIFT REDUCTION DETERMINATION FOR OVERLAY METROLOGY

(75) Inventors: Yung-Yao Lee, Zhubei (TW); Ying Ying Wang, Xin-Zhu (TW); Heng-Hsin Liu, New Taipei (TW); Heng-Jen Lee, Baoshan Township, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 27 days.

(21) Appl. No.: 13/457,832

(22) Filed: Apr. 27, 2012

(65) Prior Publication Data

US 2013/0286395 A1 Oct. 31, 2013

(51) Int. Cl.
*G01B 11/00* (2006.01)

(52) U.S. Cl.
USPC .......................................................... 356/401

(58) Field of Classification Search
USPC ................................................ 356/401, 456
See application file for complete search history.

(56) References Cited

U.S. PATENT DOCUMENTS

| | | | |
|---|---|---|---|
| 5,923,041 A | 7/1999 | Cresswell et al. | |
| 6,842,247 B1 | 1/2005 | Wehrens et al. | |
| 6,937,337 B2 | 8/2005 | Ausschnitt et al. | |
| 7,433,039 B1* | 10/2008 | Levinski et al. | 356/401 |
| 2005/0157296 A1* | 7/2005 | Hayano | 356/401 |
| 2007/0195325 A1 | 8/2007 | Hayano | |
| 2012/0038929 A1* | 2/2012 | Den Boef et al. | 356/456 |

OTHER PUBLICATIONS

"Sensors and Metrology—2 Optical Microscopy and Overlay Measurements", Lecture 18: Sensors and Metrology II, EE290H F05, p. 1-29.
Office Action dated Apr. 21, 2014 in connection with Korean Patent Application No. 10-2013-0046163, p. 1-8.

* cited by examiner

*Primary Examiner* — Tarifur Chowdhury
*Assistant Examiner* — Jamil Ahmed
(74) *Attorney, Agent, or Firm* — Eschweiler & Associates, LLC

(57) ABSTRACT

One embodiment relates to a method for semiconductor workpiece processing. In this method, a baseline tool induced shift (TIS) is measured by performing a baseline number of TIS measurements on a first semiconductor workpiece. After the baseline TIS has been determined, the method determines a subsequent TIS based on a subsequent number of TIS measurements taken on a first subsequent semiconductor workpiece. The subsequent number of TIS measurements is less than the baseline number of TIS measurements.

19 Claims, 7 Drawing Sheets

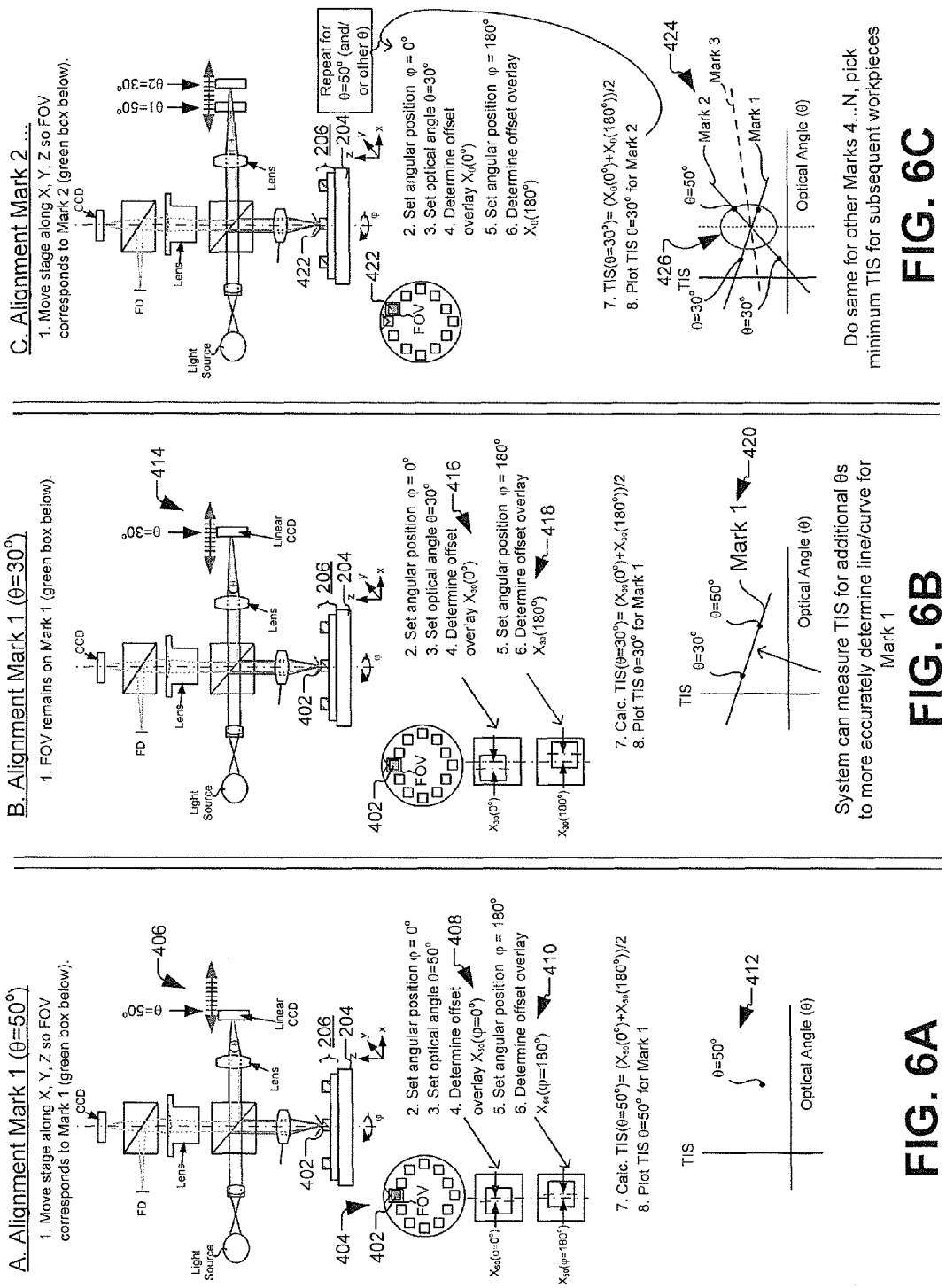

TOOL INDUCED SHIFT REDUCTION DETERMINATION FOR OVERLAY METROLOGY

BACKGROUND

Over the last four decades, the density of integrated circuits has increased by a relation known as Moore's law. Stated simply, Moore's law says that the number of transistors on integrated circuits (ICs) doubles approximately every 18 months. Thus, as long as the semiconductor industry can continue to uphold this simple "law," ICs double in speed and power approximately every 18 months. In large part, this remarkable increase in the speed and power of ICs has ushered in the dawn of today's information age.

Unlike laws of nature, which hold true regardless of mankind's activities, Moore's law only holds true only so long as innovators overcome the technological challenges associated with it. One of the advances that continues to allow Moore's law to hold true is optical overlay metrology, which allows extremely accurate overlay measurements to be performed between patterned layers. For example, optical overlay metrology can measure how accurately a first patterned layer aligns with respect to a second patterned layer above or below the first patterned layer. If a workpiece contains layers that are out of alignment, then the substrate can be re-worked (e.g., a first or second layer which is photoresist can be stripped) and returned to the photolithography process to be exposed again at a corrected alignment. Unfortunately, the tolerances or measurement uncertainties of these metrology techniques are too large for next generation devices.

BRIEF DESCRIPTION OF THE DRAWINGS

FIGS. 6A-6C show an technique whereby a number of alignment marks are imaged using different optical angles to help limit tool induced shift in accordance with some embodiments.

DETAILED DESCRIPTION

Figure 1A:
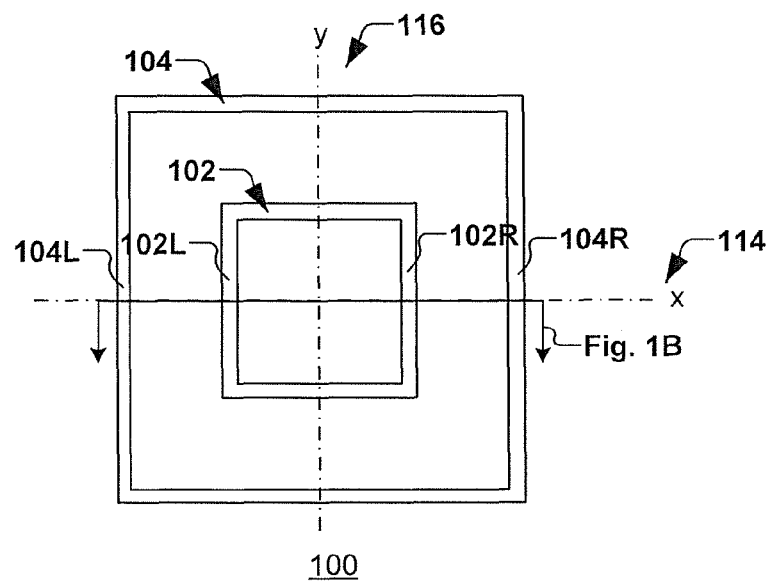
FIG. 1A shows a top view of a bar in bar alignment mark.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

To measure overlay offset between patterned layers on a semiconductor workpiece, alignment marks are used. The most commonly used overlay alignment marks are squares, generally referred to as "bar-in-bar" marks, some examples of which are shown in FIGS. 1A-1E. Although bar-in-bar alignment marks are discussed herein for purposes of explanation, it will be appreciated that a vast assortment of other alignment marks could also be used, and the present disclosure is in no way limited to bar-in-bar alignment marks.

FIG. 1A shows a top view of bar-in-bar mark 100 having inner and outer bar marks 102, 104, respectively, disposed on upper and lower layers, respectively. For example, lower layer on which outer bar mark 104 is formed could be a semiconductor substrate, a metal layer, a dielectric layer, or any other layer or layers; while the upper layer on which inner bar mark 102 is formed could be a photoresist layer or other mask layer, for example.

Figure 1B:
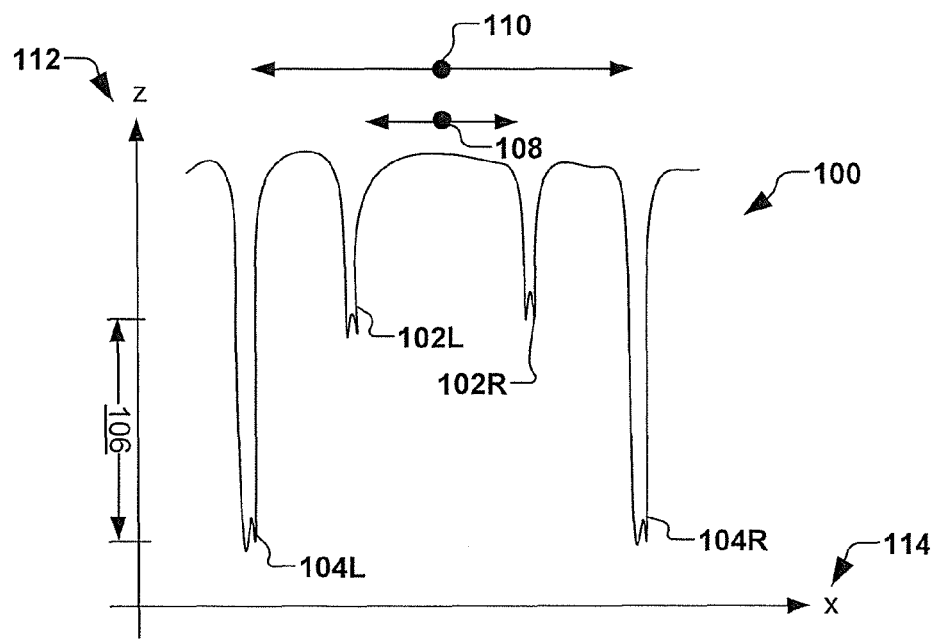
FIG. 1B shows a cross-sectional measurement of the bar in bar alignment mark of FIG. 1A.
Figure 1C:
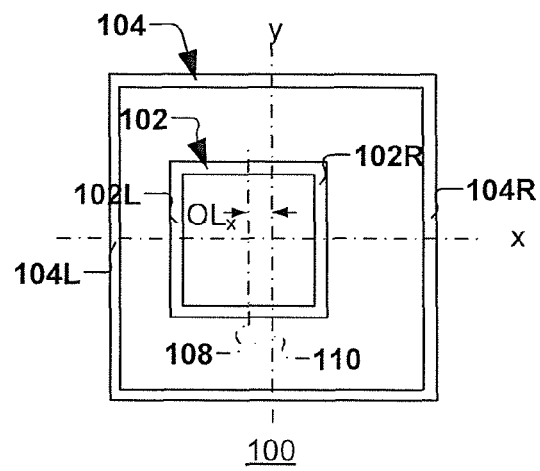
FIGS. 1C-1E shows various types of overlay offset conditions.
Figure 1D:
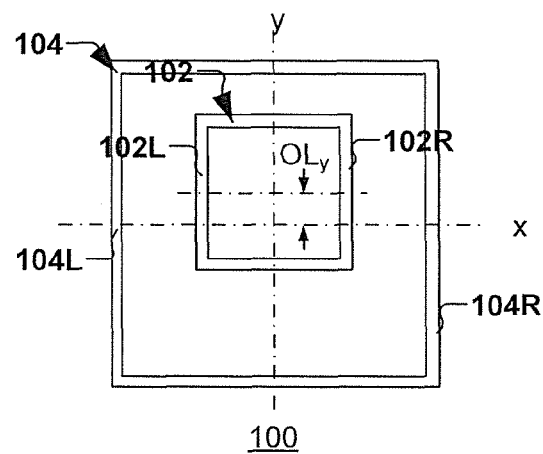
Figure 1E:
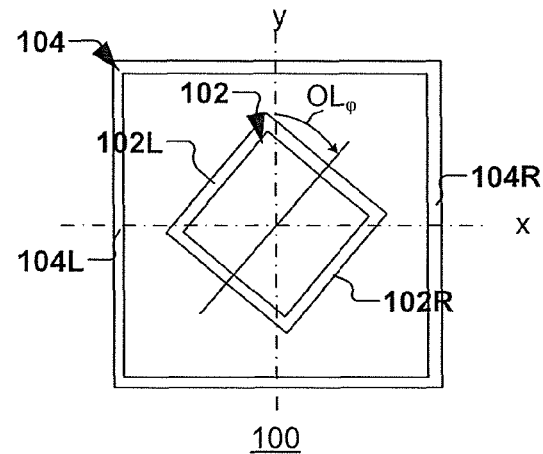

FIG. 1B shows a cross section of FIG. 1A's bar-in-bar mark 100, where upper layer (e.g., inner bar mark) and lower layer (e.g., outer bar mark) are separated by height difference 106 measured on z-axis 112. The z-axis 112 extends substantially perpendicular to a face surface of a semiconductor substrate on which the bar-in-bar mark 100 is formed, while the x- and y-axes 114, 116 (see FIG. 1A) extend in the plane of the face surface, albeit perpendicular to one another.

To determine the extent of misalignment or overlay offset between the inner and outer bar marks 102, 104, the metrology system takes optical measurements to determine the locations of left and right inner bar marks 102L, 102R. Based on these locations 102L, 102R, the metrology system calculates the location of an inner median point 108. Similarly, after locations of left and right outer bar marks 104L, 104R are measured, the metrology system calculates an outer median point 110. The overlay-offset in the X-direction, if any, is determined by calculating the difference between the median point 108 and the median point 110 (see $OL_x$ in FIG. 1C). This same method can be used to determine the overlay-offset in the Y-direction (see $OL_y$ in FIG. 1D), and/or skew or rotation between the layers (see $OL_\phi$ in FIG. 1E).

A zero overlay-offset means that the inner bar mark 102 (e.g., upper photoresist layer), when viewed through the microscope, appears to be exactly centered within the lower outer bar mark 104 (e.g., lower substrate, dielectric, or metal layer). However, even if the measured overlay-offset is zero (e.g., as shown by the case in FIG. 1A), an underlying displacement error between the upper and lower layers may still exist, despite the fact that the upper and lower layers appear to be perfectly aligned when viewed through the microscope. One reason for this underlying displacement error is tool induced shift (TIS). Tool induced shift (TIS) is a measurement error arising from imperfections in the optical measuring tool. TIS can be caused, for example, when light from a light source is not exactly perpendicular to the substrate surface or is not telecentric.

As now discussed with regards to FIGS. 2A-2D, to measure TIS, a metrology system can perform a series of measurements where overlay offset is measured at 0° and 180° on a diametric axis extending through a semiconductor workpiece for a number of alignment marks on the workpiece. The overlay offsets measured at 0° and 180° for a given alignment mark are equal and opposite so as to cancel each other out (notwithstanding TIS). Any residual difference between the overlay offset measured at 0° and 180° is indicative of TIS for that alignment mark.

Figure 2A:
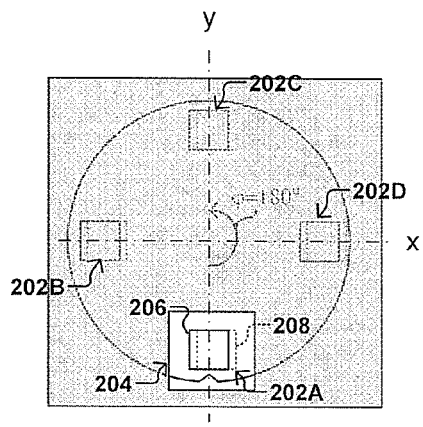
FIGS. 2A-2D show a technique for measuring tool induced shift (TIS).
Figure 2B:
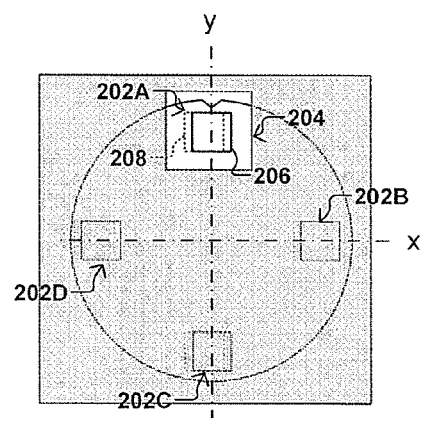
Figure 2C:
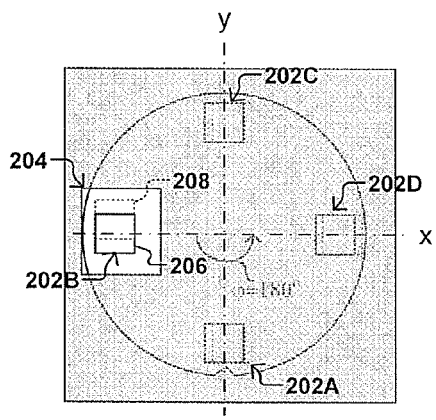
Figure 2D:
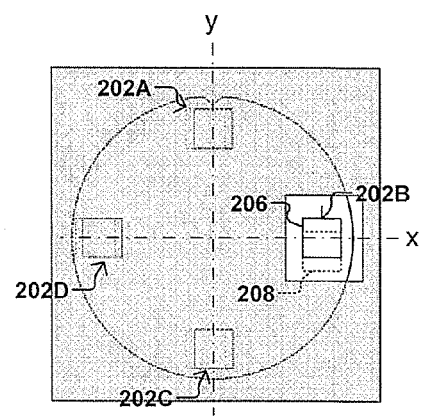

For example, FIGS. 2A-2B show an overlay offset measurement for a first alignment mark 202A positioned within a field of view (FOV) 204 for a metrology tool. The first alignment mark 202A includes a first layer 206 and a second layer 208, which may be undesirably offset or skewed relative to one another. In FIG. 2A's example when the workpiece is oriented at 0°, the overlay offset between the first and second layers 206, 208 is measured to be +Δx on the x-axis (i.e., second layer 208 is offset to the right in FIG. 2A relative to first layer 206). When the workpiece is rotated by 180° (FIG. 2B), the overlay offset between the first and second layers is measured to be −ΔX (i.e., second layer 208 is offset to the left in FIG. 2A relative to first layer 206). Although these overlay offsets should be exactly equal and opposite under ideal conditions, in practical situations there are slightly different due to TIS. Hence, by subtracting the two overlay offset measurements taken at 0° and 180°, respectively, a TIS value can be determined based on the first alignment mark 202A. Similarly, in FIGS. 2C-2D, the FOV 204 has been moved to a second alignment mark 202B and the overlay offset between the first and second layers 206, 208 can be measured for this alignment mark 202B at 0° (in this case the overlay offset is +Δy). The workpiece is again rotated 180° (FIG. 2D), and the overlay offset between the first and second layers 206, 208 is re-measured (resulting in a measured overlay offset of −Δy). By subtracting the two overlay offset measurements in FIGS. 2C-2D, which again tend to cancel one another out (notwithstanding TIS), a TIS value can be determined based on the second alignment mark 202B. The FOV 204 can be moved to additional alignment marks (e.g., 202C, 202D), 0° and 180° overlay offset measurements taken at the respective alignment marks, and additional TIS measurements determined. In this way, the TIS over the workpiece can be determined with relatively good accuracy.

Unfortunately, carrying out full-blown TIS measurements on each alignment mark of each and every workpiece requires a large number of TIS measurements, which can reduce the number of workpieces per hour (WPH) output from the fab. One way to reduce this overhead would be to carry out full-blown TIS measurements on only select workpieces (e.g., carrying out TIS measurements for 12 workpieces out of every 100 workpieces processed), but such a technique carries a risk that the measured workpieces are statistically well above average in terms of TIS, and thus changes in TIS might be missed, causing poor yield results for those overlooked workpieces. Further, carrying out full-blown TIS measurements on only select workpieces may also still require considerable TIS measurements, which can diminish the number of workpieces per hour output from the fab. Therefore, improved TIS measurement techniques are set forth herein.

Figure 3:
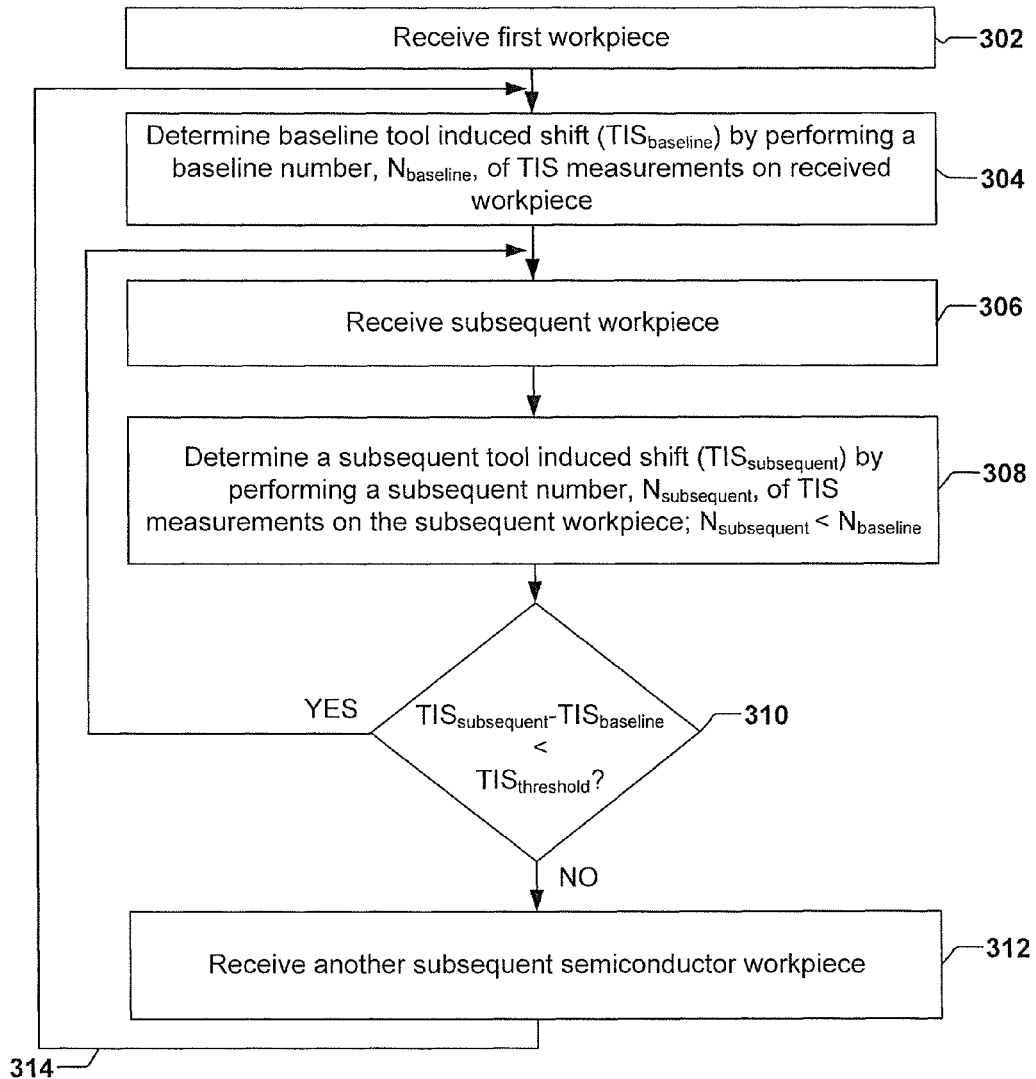
FIG. 3 is a flowchart illustrating an embodiment for determining a tool-induced-shift (TIS) while providing increased wafer throughput.

FIG. 3 shows a TIS metrology 300 that provides good workpiece throughput while still providing reasonably accurate TIS measurements continuously during workpiece processing. FIG. 3's metrology method provides rigorous TIS measurements on an initial workpiece. As long as the measured TIS measurements are greater than a TIS threshold, the method performs limited TIS measurements on subsequent workpieces. This scheme thus still provides a reasonable level of TIS measurement to hedge against large and unexpected TIS changes, while at the same time gives a reasonable level of workpiece throughput.

Method 300 starts at 302 when a first semiconductor workpiece is received.

At 304 a TIS baseline level ($TIS_{baseline}$) is determined by performing a baseline number ($N_{baseline}$) of TIS measurements on a first semiconductor workpiece. For example, consider a scenario where the first workpiece includes 12 alignment marks distributed over a face of the workpiece, and there are 8 sample points on each alignment mark. In taking TIS measurements, there would be 8 samples taken for each of the 12 alignment marks. These samples would be measured for a 0° orientation for each alignment mark and a 180° orientation for each alignment mark, as described previously in FIG. 2A-2D. Thus, a total of 8×12×2=192 samples would be taken to determine the TIS baseline level in this example. The number of alignment marks and sample points on each alignment mark are not limited to these values, and can vary widely depending on the technology employed. In addition, in many embodiments, the optical angle will also be varied to determine the $TIS_{baseline}$ level.

At 306, a subsequent semiconductor workpiece is received.

At 308, a subsequent tool induced shift ($TIS_{subsequent}$) is determined by performing a subsequent number ($N_{subsequent}$) of TIS measurement on the subsequent workpiece. To improve workpiece throughput, the subsequent number is less than the baseline number. For example, if the second workpiece (like the first workpiece) includes 12 alignment marks and there are 8 sample points on each alignment mark, the methodology might only take TIS measurements on three out of the 12 alignment marks (e.g., for a total of 3×12×2=72 samples for $TIS_{subsequent}$). Thus, this still provides some level of TIS checking to help hedge against sudden changes in TIS, but still allows fairly high levels of workpiece throughput.

At 310, the method 300 determines the difference between the subsequent TIS and the baseline TIS, and compares the difference to a predetermined TIS threshold. So long as the difference is less than the predetermined TIS threshold ('Yes' at 310), the baseline TIS measurement is still deemed to be valid, and therefore the method continues to process subsequent workpieces with the reduced number of TIS measurements ($N_{subsequent}$) to keep workpiece throughput high.

On the other hand, if the difference is greater than the predetermined TIS threshold ('No' at 310), the baseline TIS might be outdated and so the baseline TIS is re-measured as shown by path 314.

Figure 4:
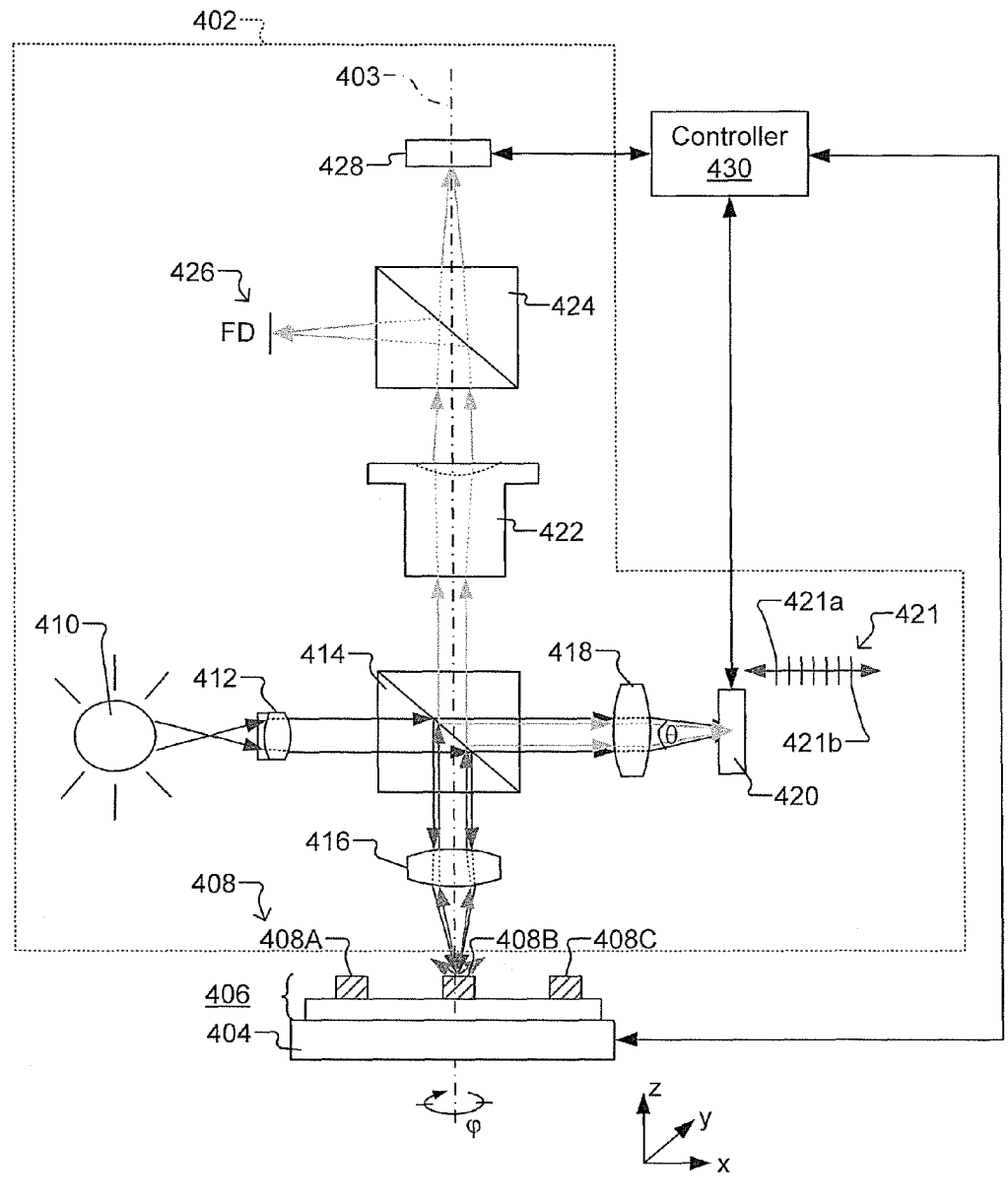
FIG. 4 is a metrology system in accordance with some embodiments.

FIG. 4 shows a block diagram of a metrology system 400 in accordance with some embodiments of the present disclosure. The metrology system 400 includes optical assembly 402 having an optical axis or Z-axis 403, a stage 404 to retain a semiconductor workpiece 406, and a controller 430. The stage 404 can be moved in the X, Y, and Z directions, and can be rotated about the Z-axis through angle φ. Note this X, Y, Z movement and φ rotation is relative movement/rotation between the optical assembly 402 and the stage 404, such that the stage 404 can move or the optical assembly 402 can move (or the stage and optical assembly can move in coordinated fashion) to realize desired movement/rotation.

The semiconductor workpiece 406 includes one or more alignment marks 408 which indicate whether two or more layers on the workpiece are accurately aligned with respect to one another. The semiconductor workpiece 406 can be, for example, a silicon wafer, a glass or quartz substrate, or a substrate made from semiconductor materials other than silicon. The semiconductor workpiece 406 can also include non-semiconductor materials, such as dielectric layers and photoresist layers for example.

During operation, the stage 404 and optical assembly 402 move to position an alignment mark 408B on the workpiece within a field of view (FOV) of the optical assembly 402. A light source 410 outputs light towards first lens 412, which parallelizes or collimates the light before it strikes a prism or beamsplitter 414. A first portion of the light is reflected by the beamsplitter 414 along z-axis 403 towards second lens 416 and is focused onto alignment mark 408B. Some of this light striking the alignment mark 408B is scattered back away from the second lens 416, while other light is reflected back into the second lens 416. This light passes back through the second lens 416 and is split again by the beamsplitter 414. Again, some light passes through to third lens 418, where it is focused at an optical angle, θ, onto an imaging device 420 (e.g., CCD). As will be appreciated in more detail below, the position of the imaging device 420 can be stepped through a number of different positions 421 to change the optical angle θ. For example, when imaging device 420 is at position 421a, the optical angle will be greater than when imaging device 420 is at position 421b.

Light ultimately passes up along Z-axis 403 through a fourth lens 422 (e.g., a tubular lens), and strikes a second beamsplitter 424. Some of this light is then processed by a focus diagnostic (FD) element 426, which monitors light intensity and creates a signal used for auto focus. Thus, FD can adjust the height of stage 404 in Z-direction, for example. Light also strikes CCD 428, which measures the intensity of reflected light for each optical angle (θ) and for each angular orientation (ϕ) for each alignment mark on the workpiece 406. Controller 430 (e.g., microprocessor) then determines a TIS 3 sigma minimum for these measurements. The TIS 3-sigma minimum can be used to help determine if subsequent alignment measurements are within specification.

Figure 5:
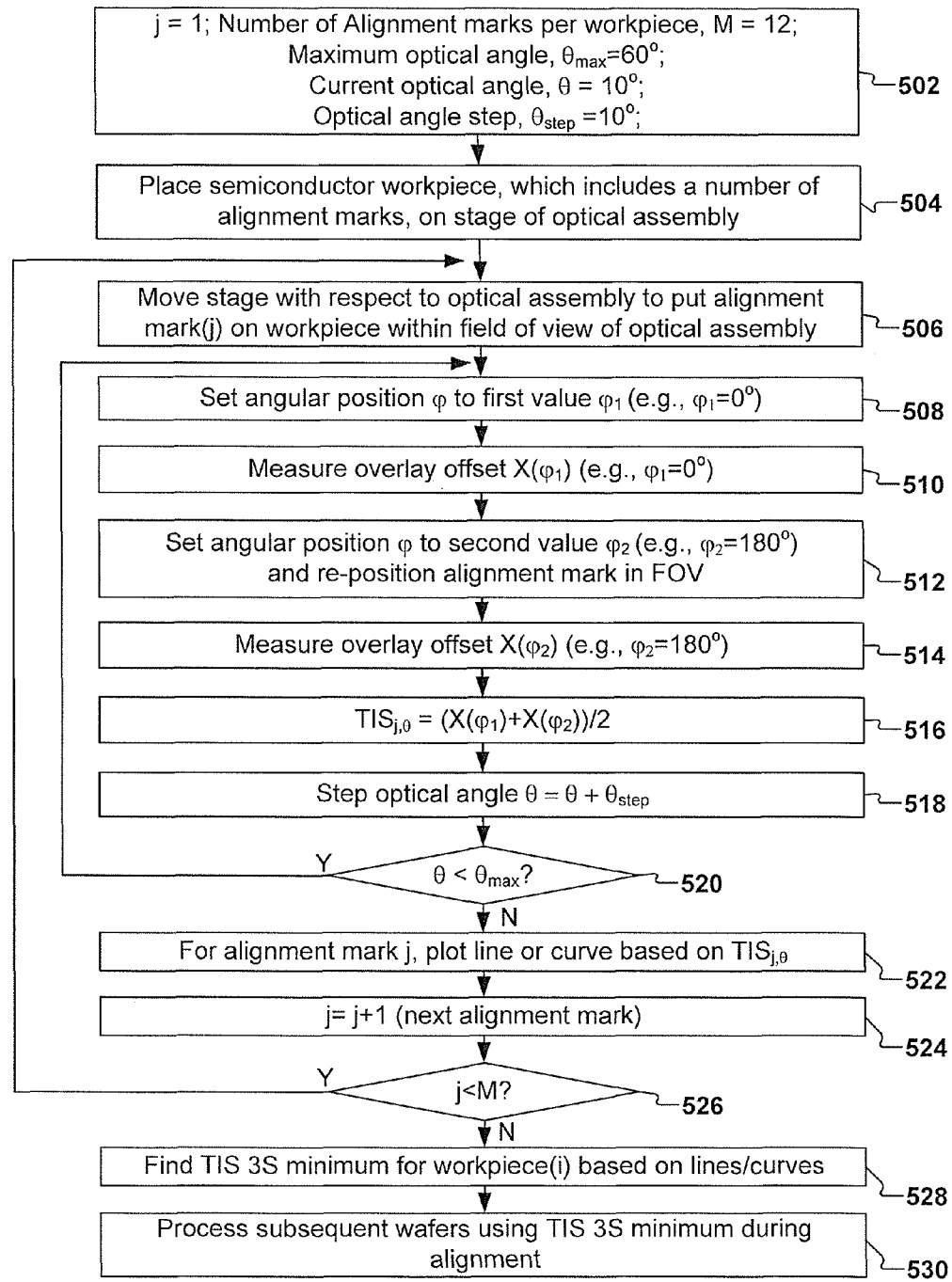
FIG. 5 is a flowchart illustrating a method for aligning workpieces while accounting for tool-induced shift (TIS) in accordance with some embodiments.

FIG. 5 illustrates a TIS metrology method 500 in accordance with some embodiments of the present disclosure. While this method and other methods disclosed herein may be illustrated and/or described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

As FIG. 5 shows, the method starts at 302 when a series of variables are initialized. In this example, j is an alignment mark index and is initialized to 1; M is the number of alignment marks per workpiece and is initialized to 12; $θ_{max}$ is the maximum optical angle and is set to 60°; θ is the current optical angle (see 421 in FIG. 4) and is initialized to 10°; and $θ_{step}$ is the optical angle step and is set to 10°. These initialization values are selected here for purposes of understanding, and can vary widely in practical implementations. Thus, these initialization values in no way limit the scope of this disclosure.

After the variables are initialized, the method proceeds to 504 when a semiconductor workpiece is loaded onto a stage of an optical assembly, such as shown in FIG. 4. The workpiece typically includes a number of alignment marks arranged over the surface of the workpiece.

At 506, the stage is moved with respect to the optical assembly to put a first alignment mark within a field of view of the optical assembly.

At 508, the angular orientation ϕ is set to a first value $ϕ_1$. For example, if the center of the workpiece corresponds to the origin and an alignment notch on the workpiece is assigned an angle of 0°, the angular orientation, in some embodiments, is set at 0°.

At 510, while the angular orientation ϕ is set to the first value $ϕ_1$, an overlay offset is measured, such as previously described in FIG. 1A-1B for example.

At 512, the workpiece and optical assembly are rotated with respect to one another, such that the angular orientation ϕ now corresponds to a second value $ϕ_2$. For example, assuming the alignment notch on the workpiece is assigned an angle of 0°, the angular orientation, in some embodiments, is set at 180°.

At 514, while the angular orientation ϕ is set to the second value $ϕ_2$, an overlay offset is re-measured. The overlay offset measured in 510 and 514 can be different because of parallax, for example, if the surface of the workpiece is not perpendicular to the optical axis of the illumination system and/or of the optical system is not exactly perpendicular to the substrate. This overlay offset to parallax, however, should be cancelled because of the 180° workpiece rotation. TIS, however, will not be cancelled.

In 516, accordingly, the TIS is calculated according to the following equation:

$$TIS_{j,θ}=(X(ϕ_1)+X(ϕ_2))/2,$$

Where $X(ϕ1)$ is the overlay offset measured at the first angular orientation and $X(ϕ2)$ is the overlay offset measured at the second angular orientation.

In 518, the method increments the optical angle θ by a predetermined step (see 421 in FIG. 4), and then evaluates whether all the optical angles have been evaluated for the current alignment mark in 520. If there are more optical angles θ to be evaluated for the current alignment mark (Y at 520), the method goes back to 506 and repositions the stage and measures the TIS for the next optical angle. In this example, the predetermined step is 10° for purposes of illustration, but in other embodiments other step values ranging from a fraction of a degree to tens or hundreds of degrees can occur.

When all optical angles for a given alignment mark on a workpiece have been evaluated (N at 520), the method proceeds to 522 and plots a line or curve of the TIS vs. optical angle for the alignment mark. In particular, the "stepping" of the optical angle θ and measurement of corresponding overlay offsets (e.g., at 0° and 180° optical angles for each optical angle θ) help provide accurate TIS measurements. In effect, this helps to make sure that the microscope is accurately focused on the given alignment mark.

In 524, the method proceeds to the next alignment mark on the workpiece, and steps through the angular orientations and optical angles in turn to calculate another line or curve of the TIS vs. optical angle for the next alignment mark.

The method continues evaluating alignment marks in this way until all alignment marks have been evaluated (N at 526). When all alignment marks have been evaluated for the workpiece, the method proceeds to 528 and determines a TIS 3-sigma minimum based on the measured lines/curves from 522. In 530, the method evaluates overlay offset for subsequent workpieces by using the determined TIS 3-sigma minimum. For example, when determining whether an offset overlay measurement for a subsequent workpiece is within acceptable tolerances, the determined TIS 3-sigma minimum can be taken into account to determine whether the measured offset overlay is acceptable or fails outside of acceptable tolerance. Thus, consider an example where the maximum acceptable overlay offset tolerance is 1 nm between two layers. If the measured overlay offset (notwithstanding TIS) is 0.8 nm and the determined TIS 3-sigma minimum is 0.3 nm, the actual overlay offset (accounting for TIS) could be 1.1 nm, which is greater than the maximum tolerance of 1 nm and thus realignment can be carried out. On the other hand, If the measured overlay offset (notwithstanding TIS) is 0.8 nm and the determined TIS 3-sigma minimum is 0.1 nm, the actual overlay offset (accounting for TIS) could be 0.9 nm, which is less than the maximum tolerance of 1 nm and thus no alignment is required.

It will be appreciated that the blocks in FIG. 5's methodology can be arranged in different orders. For example, in some embodiments, all optical angles θ will be measured for a given alignment mark for a first angular orientation φ1, and subsequently all optical angles θ for the given alignment mark will be measured for a second angular position φ2. Other orders are also possible. Thus, FIG. 5 is merely just one example methodology and is not limiting in any sense.

Thus, it will be appreciated that some methods disclosed herein relate to a method of measuring tool induced shift (TIS). In this method, the semiconductor workpiece is moved so that a field of view (FOV) corresponding to a first alignment mark on the workpiece changes its directional orientation from a first angular orientation to a second angular orientation. The first and second directional orientations are measured with respect to a first diametric axis extending through the workpiece. The method views the first alignment mark at a plurality of optical angles at both the first angular orientation and the second angular orientation. The method measures a first plurality of overlay offsets, respectively, for the plurality of optical angles at the first and second angular orientations.

Other methods relate, to a method for semiconductor workpiece processing. In some of these methods, a baseline tool induced shift (TIS) is determined by performing a baseline number of TIS measurements on a first semiconductor workpiece. After the baseline TIS has been determined, a subsequent TIS is determined based on a subsequent number of TIS measurements taken on a first subsequent semiconductor workpiece. The subsequent number of TIS measurements is less than the baseline number of TIS measurements.

Other embodiments relate to a metrology system. The system includes a light source to provide light towards an optical axis of the metrology system. A moveable stage retains a workpiece having one or more alignment marks thereon, such that light from the light source impinges on the alignment mark. The moveable stage rotates the workpiece with respect to the optical axis to first and second angular orientations that are measured with respect to a first diametric axis extending through the workpiece. A focal diagnostic element measures light reflected from the alignment mark and moves the stage based on the measured light to bring the alignment mark into focus. An imaging device steps through a number of optical angles for the first and second angular orientations to measure a tool induced shift (TIS) of the metrology system.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for measuring tool induced shift (TIS), comprising:
   positioning a moveable stage having a semiconductor workpiece thereon so that a field of view (FOV) of an imaging system corresponds to a first alignment mark on the semiconductor workpiece;
   stepping an imaging device of the imaging system through a plurality of different positions along an optical axis, wherein the plurality of different positions corresponds a plurality of different optical angles, respectively;
   for each of the plurality of different positions, changing a directional orientation of the semiconductor workpiece from a first angular orientation to a second angular orientation, wherein the first and second angular orientations are measured with respect to a first diametric axis extending through the semiconductor workpiece; and
   measuring a first plurality of overlay offsets, respectively, for the plurality of optical angles at the first and second angular orientations for the first alignment mark.

2. The method of claim 1, further comprising:
   using the first plurality of overlay offsets to determine a first curve or line representing TIS for the first alignment mark as a function of optical angle.

3. The method of claim 2, further comprising:
   repositioning the semiconductor workpiece so that the FOV corresponds to a second alignment mark on the semiconductor workpiece;
   viewing the second alignment mark at a plurality of optical angles at both the first angular orientation and the second angular orientation;
   measuring a second plurality of overlay offsets, respectively, for the plurality of optical angles at the first and second angular orientations for the second alignment mark; and
   determining a plurality of TISs from the second plurality of overlay offsets.

4. The method of claim 3, further comprising:
   fitting the plurality of TISs to a second line or curve for the second alignment mark;
   determining a minimum TIS based on an intersection of the first line or curve and the second line or curve.

5. The method of claim 4, further comprising:
   summing the minimum TIS with an overlay offset measured between layers on a subsequent semiconductor workpiece and comparing the sum to a maximum acceptable alignment tolerance.

6. The method of claim 1, further comprising:
   determining a first TIS by taking a difference between a first overlay offset and a second overlay offset, wherein the first overlay offset is measured at a first optical angle and the first angular orientation and wherein the second overlay offset is measured at the first optical angle and the second angular orientation.

7. The method of claim 6, further comprising:
   determining a second TIS by taking a difference between a third overlay offset and a fourth overlay offset, wherein the third overlay offset is measured at a second optical angle and the first angular orientation and wherein the third overlay offset is measured at the second optical angle and the second angular orientation.

8. The method of claim 7, further comprising:
   fitting the first and second TISs to a first line or curve for the first alignment mark.

9. A method for semiconductor workpiece processing comprising:

using an electronic metrology system to determine a baseline tool induced shift (TIS) by performing a baseline number of TIS measurements on a first semiconductor workpiece;

wherein performing the baseline number of TIS measurements includes stepping an imaging device through a plurality of different positions having a corresponding plurality of optical angles and viewing a first alignment mark at a first and second angular orientations for each different position, wherein the first and second angular orientations are measured with respect to a first diametric axis extending through the first semiconductor workpiece;

after the baseline TIS has been determined, using the electronic metrology system to determine a subsequent TIS based on a subsequent number of TIS measurements taken on a first subsequent semiconductor workpiece, wherein the subsequent number of TIS measurements is less than the baseline number of TIS measurements and wherein the first subsequent semiconductor workpiece is different from the first semiconductor workpiece.

10. The method of claim 9, further comprising:
determining a difference between the subsequent TIS measured for the first subsequent semiconductor workpiece and the baseline TIS.

11. The method of claim 10, further comprising:
based on whether the difference has a predetermined relationship with a predetermined TIS threshold, selectively re-determining the baseline TIS by performing the baseline number of TIS measurements for a second subsequent semiconductor workpiece.

12. The method of claim 11, further comprising:
if the difference does not exhibit the predetermined relationship with the predetermined threshold, performing the subsequent number of TIS measurements on the second subsequent semiconductor workpiece.

13. The method of claim 9, further comprising:
using the first plurality of overlay offsets to determine a first curve or line representing the TIS for the first alignment mark as a function of optical angle.

14. The method of claim 13, further comprising:
repositioning the first semiconductor workpiece so that the FOV corresponds to a second alignment mark on the first semiconductor workpiece;
viewing the second alignment mark at a plurality of optical angles at both the first angular orientation and the second angular orientation;
measuring a second plurality of overlay offsets, respectively, for the plurality of optical angles at the first and second angular orientations for the second alignment mark; and
determining a plurality of TISs from the second plurality of overlay offsets.

15. The method of claim 14, further comprising:
fitting the plurality of TISs to a second line or curve for the second alignment mark;
determining a minimum TIS based on an intersection of the first line or curve and the second line or curve.

16. A metrology system, comprising:
a light source to provide light towards an optical axis of the metrology system;
a moveable stage configured to retain a workpiece having one or more alignment marks thereon such that light from the light source impinges on an alignment mark, and further configured to rotate the workpiece with respect to the optical axis to first and second angular orientations that are measured with respect to a first diametric axis extending through the workpiece;
a focal diagnostic element to measure light reflected from the alignment mark and to move the stage based on the measured light to bring the alignment mark into focus;
an imaging device arranged to step through a plurality of optical angles for the first and second angular orientations to measure a tool induced shift (TIS) of the metrology system; and
a controller configured to:
determine a first line or curve representing a first TIS for a first alignment mark as a function of optical angle based on a first plurality of measured overlay offsets;
determine a second line or curve representing a second TIS for a second alignment mark as a function of optical angle based on a second plurality of measured overlay offsets; and
determine a minimum TIS based on an intersection of the first line or curve and the second line or curve.

17. The metrology system of claim 16, wherein the controller is further configured to sum the minimum TIS with an overlay offset measured between layers on a subsequent workpiece and compare the sum to an acceptable alignment tolerance.

18. The method of claim 9:
wherein performing the baseline number of TIS measurements comprises performing individual TIS measurements on a baseline number of alignment marks, respectively, on the first semiconductor workpiece; and
wherein performing the subsequent number of TIS measurements comprises performing individual TIS measurements on a subsequent number of alignment marks, respectively, on the first subsequent semiconductor workpiece.

19. The method of claim 18:
wherein the first semiconductor workpiece has a total number of alignment marks spread over a surface thereof, and wherein the first subsequent semiconductor workpiece has the same total number of alignment marks spread over a surface thereof;
wherein performing the baseline number of TIS measurements comprises performing individual TIS measurements on at least approximately all of the alignment marks on the first semiconductor workpiece; and
wherein performing the subsequent number of TIS measurements comprises performing individual TIS measurements on less than all of the total number of alignment marks spread over the surface of the first subsequent semiconductor workpiece.

* * * * *